United States Patent [19]
Dufour

[11] Patent Number: 5,590,163
[45] Date of Patent: Dec. 31, 1996

[54] FREQUENCY DIVIDER CIRCUIT, FREQUENCY SYNTHESIZER COMPRISING SUCH A DIVIDER AND RADIO TELEPHONE COMPRISING SUCH A SYNTHESIZER

[75] Inventor: Yves Dufour, Sunnyvale, Calif.

[73] Assignee: U.S. Philips Corporation, New York, N.Y.

[21] Appl. No.: 432,746

[22] Filed: May 2, 1995

[30] Foreign Application Priority Data

May 4, 1994 [FR] France ................................. 94 05483

[51] Int. Cl.⁶ ........................................... H03K 23/66
[52] U.S. Cl. ................................. 377/110; 377/47
[58] Field of Search ........................... 377/110, 47

[56] References Cited

U.S. PATENT DOCUMENTS 4,575,867   3/1986   Hogue ..................... 377/110
5,065,415  11/1991   Yamashita ................ 377/110

FOREIGN PATENT DOCUMENTS 0517335  12/1994   European Pat. Off. ....... H03K 23/66

*Primary Examiner*—Margaret Rose Wambach
*Attorney, Agent, or Firm*—Edward W. Goodman

[57] ABSTRACT

Frequency divider circuit, frequency synthesizer comprising such a divider and radio telephone comprising such a synthesizer. A frequency divider circuit according to the invention includes a succession of N divide-by-two or divide-by-three dividing cells for an input frequency signal, while specific ones of these cells can be disabled to obtain division factors smaller than $2^N$.

9 Claims, 6 Drawing Sheets

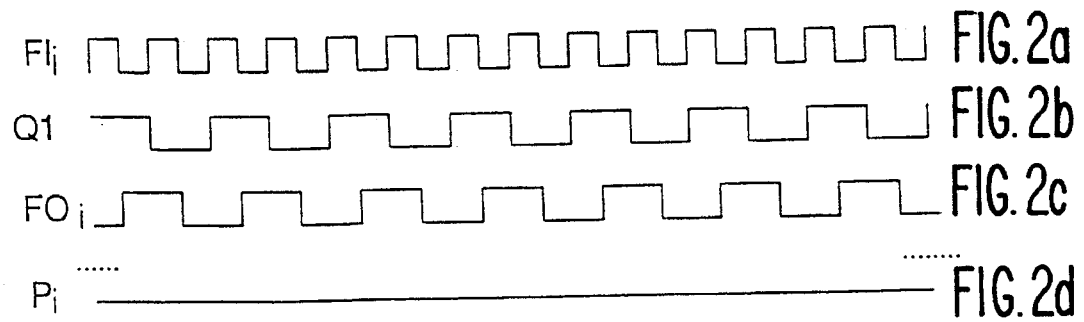
FIG. 2a
FIG. 2b
FIG. 2c
FIG. 2d
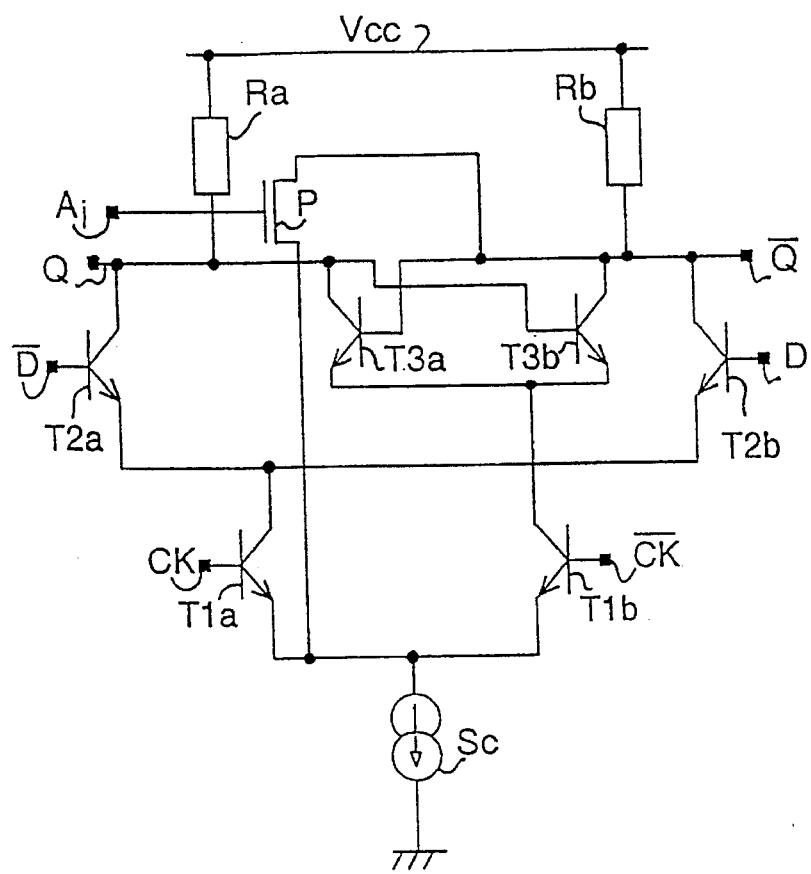
FIG. 5

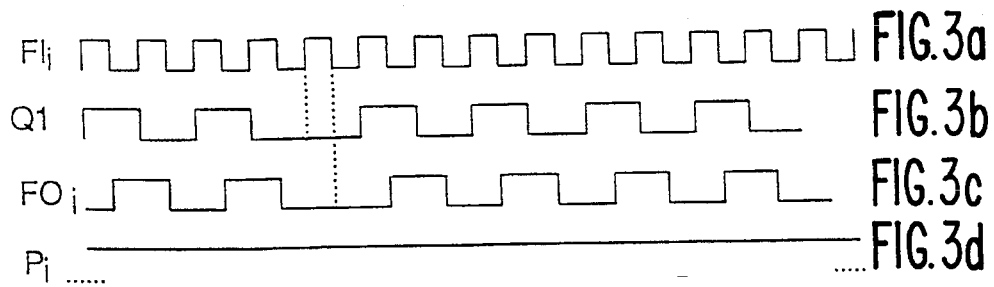
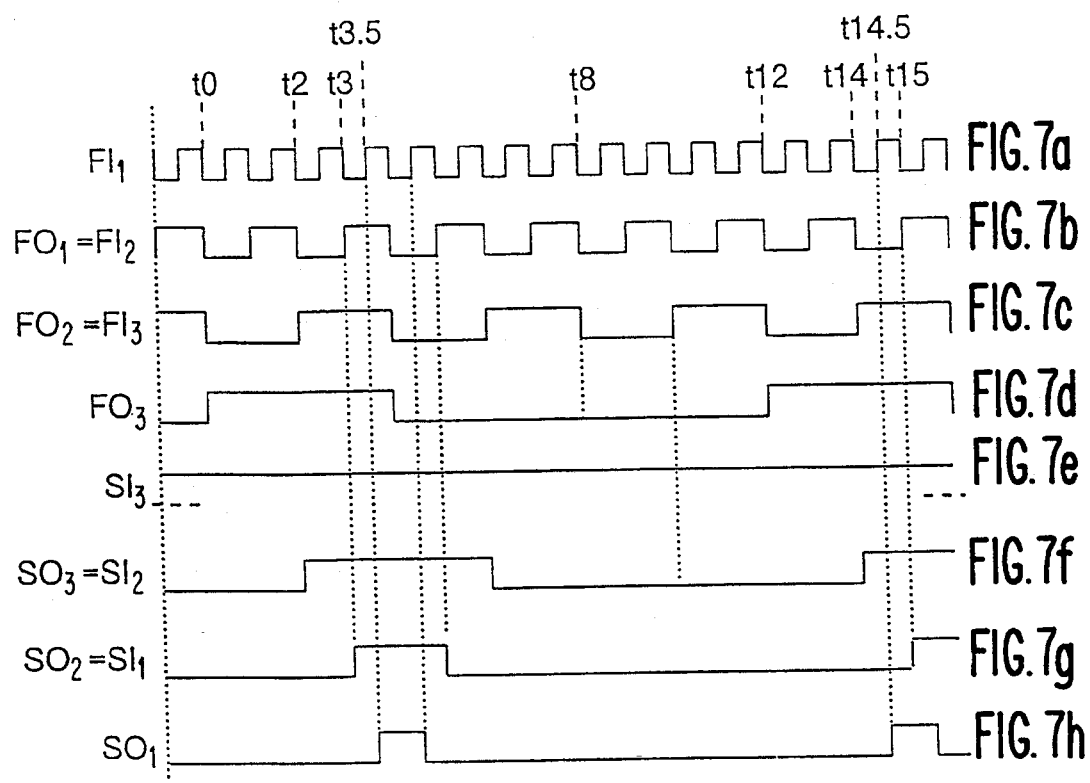

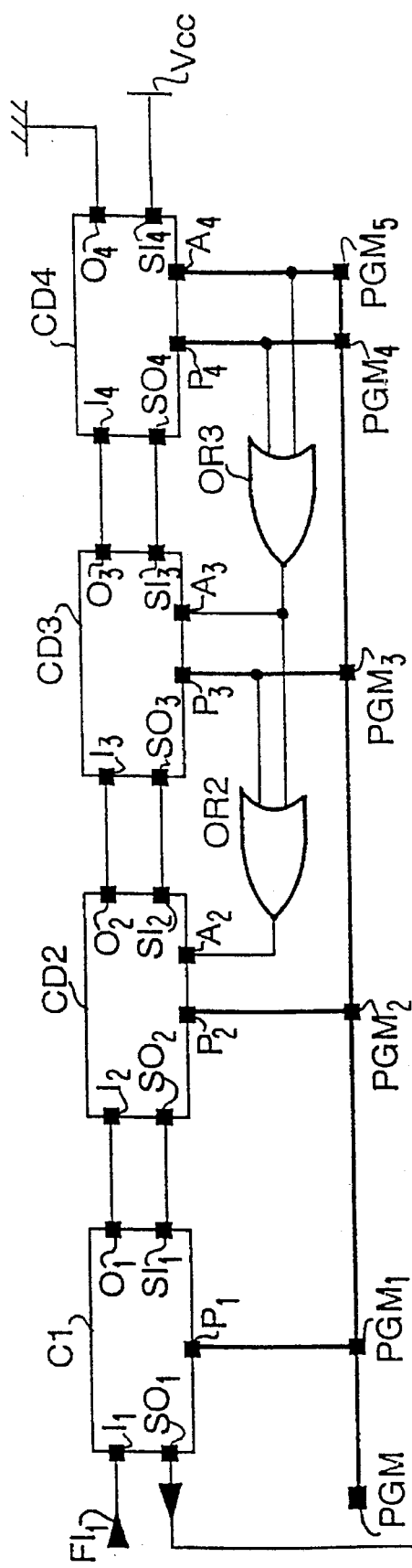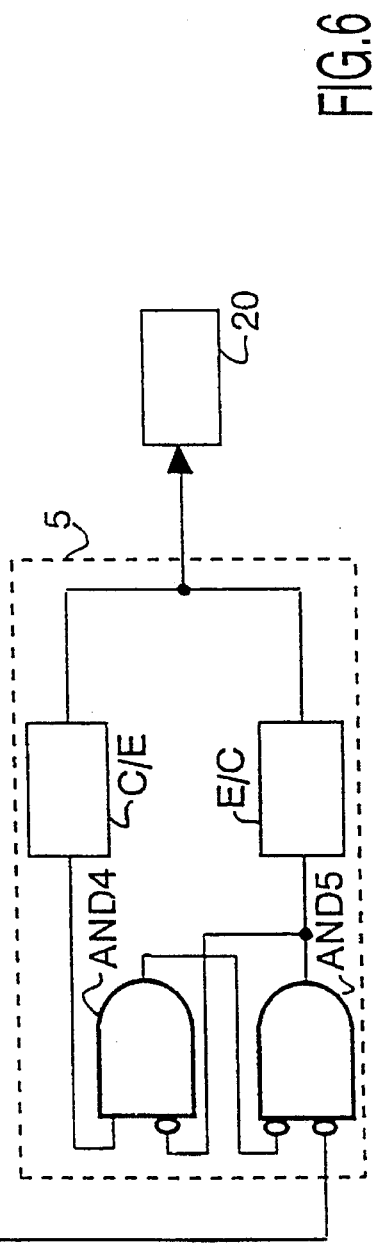
FIG.6

PGM

FREQUENCY DIVIDER CIRCUIT, FREQUENCY SYNTHESIZER COMPRISING SUCH A DIVIDER AND RADIO TELEPHONE COMPRISING SUCH A SYNTHESIZER

BACKGROUND OF THE INVENTION

1. Field of the Invention

The present invention relates to a programmable frequency divider circuit comprising p cascade-connected frequency-dividing cells, each of these cells representing a division of rank i, all cells being switchable between a normal divide-by-two mode, and a programmed divide-by-three mode, a cell of arbitrary rank i comprising:

a first input for an input frequency signal, a first output for an output frequency signal to be applied to the first input of the cell of higher rank, a second input for an enable signal for the programmed mode, a third input for a programming signal, a second output for a signal generated in response to the enable signal received through its second input and applied to the second input of the cell of lower rank as an enable signal.

The present invention has important applications especially for the realization of the frequency synthesizer in the field of radio transmissions.

2. Description of the Related Art

Such a divider circuit is described in U.S. Pat. No. 5,349,622, corresponding to European Patent Application no. 0 517 335 filed by Applicants on $4^{th}$ Jun. 1992. Each cell of this circuit divides the input frequency signal by two in the normal mode and by three in the programmed mode, so that the minimum division factor of this circuit is equal to $R_{min}=2^p$, and that its maximum division factor is equal to $R_{max}=2^{p+1}-1$.

With such a circuit it is thus impossible to obtain very high and very low division factors.

SUMMARY OF THE INVENTION

It is an object of the present invention to propose a circuit that provides a solution to this problem.

Therefore, a programmable divider circuit according to the invention and the circuit described in the introductory paragraph is characterized in that at least one cell has an additional input which makes it possible to disable the circuit.

In a particularly advantageous embodiment a divider circuit according to the invention comprises means for:

disabling the cells from rank p to p-q, selecting an output signal of said divider circuit which has the same frequency as that of the output signal of the cell of rank p-q-1.

This embodiment provides the advantage of being particularly simple, especially when the frequency divider circuit additionally comprises means for tapping the signal supplied on the second output of the first cell as an output signal.

In effect, the signal supplied on the second output of the first cell has the same frequency as that of the output signal of the last active cell. The choice of such an output thus provides the advantage of being independent of the number of disabled cells. Moreover, as the signal supplied on this output is derived from the input frequency signal of the circuit, the signal has a phase noise which is very low relative to that of the output frequency signal of the last active cell.

The output signal thus obtained has a low duty cycle and a divider circuit according to the invention thus advantageously comprises means for increasing this duty cycle.

The invention likewise relates to a frequency synthesizer which comprises a programmable frequency divider circuit as described in the previous paragraphs, and a radio telephone of which either the transmitter circuit or the receiver circuit includes such a synthesizer.

BRIEF DESCRIPTION OF THE DRAWINGS

Other features, details and advantages of the present invention will be made clear in the description which is to follow with reference to the appended drawings which are given by way of non-limiting example, in which:

FIG. 2 shows a timing diagram explaining the operation in the normal mode of a cell as shown in FIG. 1, FIG. 3 shows a timing diagram explaining the operation in the programmed mode of a cell as shown in FIG. 1.

FIG. 5 shows for said first embodiment a D-type flip-flop intended to be integrated in a cell as shown in FIG. 4;

FIG. 6 shows said first embodiment for a divider circuit according to the invention of which the division factor varies between 2 and 31;

FIG. 7 shows a timing diagram which explains the operation of a divider circuit as shown in FIG. 6 for a division by 12;

DESCRIPTION OF PREFERRED EMBODIMENTS

Figure 1:
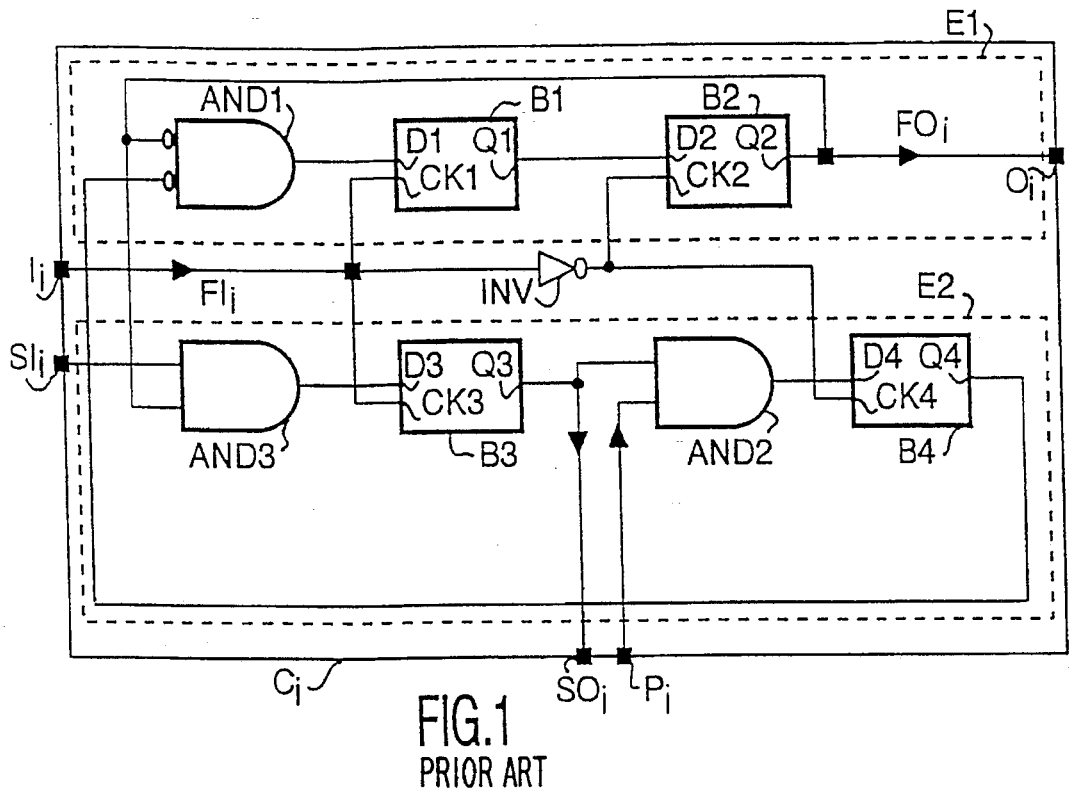
FIG. 1 shows the conventional diagram of a divide-by-two or divide-by-three dividing cell.

According to FIG. 1 a divide-by-two or divide-by-three dividing cell of rank $C_i$ comprises a divide-by-two divider stage for a signal having input frequency $FI_i$ and a swallow stage E2 in the circuit for dividing said signal $FI_i$ by three.

The stage E1 comprises two D-flip-flops B1 and B2 in a cascade combination. The clock input CK1 of flip-flop B1 forms the first input $I_i$ of the cell and receives the signal having input frequency $Fi_i$. The clock input CK2 of flip-flop B2 receives the inverted input frequency signal $\overline{FI_i}$ coming from an inverter INV. The output Q2 of the flip-flop B2 forms the first output $O_i$ of the cell and is looped back after being inverted to a first input of an AND-gate denoted AND 1, whose output is connected to the data input D1 of the flip-flop B1.

Stage E2 comprises two D-type flip-flops B3 and B4. The clock input CK3 of flip-flop B3 receives the input frequency signal $FI_i$, and a clock input CK4 of flip-flop B4 receives the inverted input frequency signal $\overline{FI_i}$ coming from the inverter INV. The output Q3 of flip-flop B3, which forms the second output $SO_1$ of the cell, is coupled to the data input D4 of flip-flop B4 via an AND-gate denoted AND2 of which a second input forms the input $P_i$ of the cell. Output Q4 of flip-flop B4 is looped back, after being inverted, to a second input of the AND-gate AND 1. The data input D3 of flip-flop B3 is connected to the output of an AND-gate denoted AND3, of which a first input forms the second input $FI_i$ of the cell and of which a second input receives the output frequency signal $FO_i$ of the cell.

The functioning of this cell in the normal mode is explained in combination with the timing diagram of FIG. 2. In this case the programming input Pi has the 0 level. AND-gate AND2 is therefore disabled, so that the second input of AND-gate AND1 is always 1. The swallow stage E2 in the circuit does not affect the behavior of the cell.

While supposing that at the initial instant the output $O_i$ of cell $C_i$ is 0, the first input of the AND-gate AND1 is 1, so that the data input D1 of the flip-flop B1 is also 1. With a rising edge of its clock signal $FI_i$, the output Q1 of the flip-flop B1 and the input D2 of the flip-flop B2 thus become 1. And with the next falling edge of the signal $FI_i$, the output Q2 of the flip-flop B2, and thus the output $O_i$ of cell $C_i$, become 1. With the next rising edge of the signal $FI_i$, the output of the flip-flop B1 thus becomes zero again while the output $O_i$ of flip-flop B2 becomes zero again at the next falling edge. The output frequency signal $FO_i$ thus obtained on output $O_i$ of the cell thus actually corresponds to half a frequency of its input frequency signal $FI_i$.

The timing diagram of FIG. 3 explains the functioning of the cell of FIG. 1 in the programmed mode. The programming input $P_i$ is thus 1. AND-gate AND2 is therefore enabled when the second output $SO_i$ of the cell becomes 1, so that the second input of the AND-gate AND1 is thus 0 which makes it possible to "swallow" one additional period of the input frequency signal compared with the normal divide-by-two divider mode.

Figure 4:
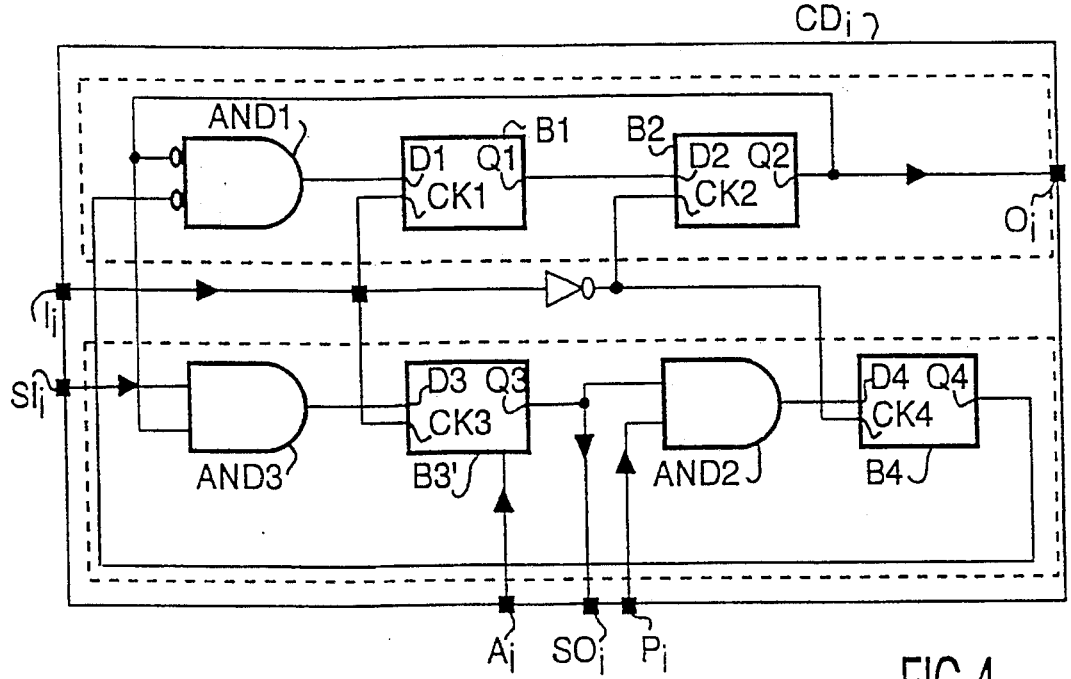
FIG. 4 shows for a first embodiment a cell according to the invention that may be disabled.

FIG. 4 gives a diagrammatic representation of a cell $CD_i$ that may be disabled. This cell is similar to that shown in FIG. 1, but flip-flop B3 is now replaced by a flip-flop B3' which has an additional input $A_i$.

This flip-flop B3' is shown in FIG. 5 for a first embodiment. The flip-flop is a conventional D-type ECL logic flip-flop formed by three differential pairs of transistors T1a and T1b, T2a and T2b, T3a and T3b. The bases of the transistors T1a and T1b are connected to the clock input CK of flip-flop B3' and to its inverted clock input $\overline{CK}$ and the bases of the transistors T2b and T2a are connected to the data input D of flip-flop B3' and to its inverted data input $\overline{D}$, respectively. The bases of the transistors T3b and T3a form the output Q of the flip-flop and its inverted output $\overline{Q}$, respectively, and are connected, respectively, on the one hand, to the collectors of the transistors T2a and T3a and also, via a resistor Ra, to a supply voltage terminal Vcc, and, on the other hand, to the collectors of the transistors T2b and T3b and also to said supply voltage terminal Vcc via a resistor Rb. The emitters of the transistors T3a and T3b are connected to the collector of transistor T1b and the emitters of the transistors T2a and T2b are connected to the collector of transistor T1a. The emitters of the transistors T1a and T1b are connected to a current source Sc.

According to the invention, flip-flop B3' further comprises a PMOS transistor denoted P, whose gate is connected to the input $A_i$ of the flip-flop, whose source is connected to the inverted output $\overline{Q}$ of the flip-flop and whose drain is connected to the emitters of the transistors T1a and T1b.

Thus when input $A_i$ is 1, transistor P behaves like an open circuit and the functioning of flip-flop B3' is that of a conventional flip-flop which copies on its output Q the value present on its input D for a rising edge of the clock signal CK.

When, in contrast, input $A_i$ is 0, transistor P behaves like a short-circuit, transistor T3a is cut off and output Q is 1, whatever the level of the signal on the D input of the flip-flop. The second output $SO_i$ of the cell is thus constantly 1, which makes it possible to disable said cell so that it does not intervene in the division. It is thus possible to inhibit any dividing action from the disabled cell and from all the cells of higher rank.

FIG. 6 shows a divider circuit according to the invention whose division factor varying between 2 and 31 is fixed by a programming word PGM of five bits denoted $PGM_i$ (where i varies between 1 and 5). Such a divider circuit comprises, in a cascade combination, a conventional cell C1 followed by three cells that may be disabled CD2, CD3 and CD4, so that the first output $O_i$ of a cell of rank i is connected to the first input $I_{i+1}$ of the cell of rank i+1, and the second output $SO_i$ of a cell of rank i is connected to the second input $SI_{i-1}$ of the cell of rank i−1. The first input of the cell C1 receives the signal to be divided $FI_1$, and its second output $SO_1$, which supplies a signal having a frequency equal to that of the output frequency signal of the last active cell, forms the output of the divider circuit. The first output of the last cell CD4 is connected to ground and its second input is connected to the supply voltage terminal Vcc, so that it continuously has the logic 1 level. Finally, the output of the divider circuit is connected to a circuit 5 which makes it possible to increase the duty cycle of the output signal.

The cells CD2, CD3 and CD4 have each an additional input denoted A2, A3 and A4, respectively. The fifth bit $PGM_5$ of the programming word is carried to input A4 of the cell CD4, whereas the fourth, third, second and first bits $PGM_4$, $PGM_3$, $PGM_2$ and $PGM_1$ are carried to the programming inputs P4, P3, P2 and P1, respectively, of the cells CD4, CD3, CD2 and C1, respectively. On the other hand, the inputs A4 and P4 of the cell CD4 form the two inputs of an OR-gate denoted OR1 whose output is connected to the input A3 of cell CD3. Similarly, the inputs A4 and P3 of cell CD3 form the two inputs of an OR-gate denoted OR2 whose output is connected to the input A2 of the cell CD2.

Thus if one wishes to divide by a number, for example, smaller than 16, the last cell CD4 is to be disabled. Therefore, its input A4 is to be brought to 0 and the programming bit $PGM_5$ is thus to be fixed to 0. The second input $SI_3$ of the cell CD3 thus continuously has the logic level 1.

If the required divisor lies between 8 and 15, the inputs A3 and A2 of the cells CD3 and CD2 are thus to be 1. Therefore, the programming bit $PGM_4$ is to be fixed at 1, so that the output of an OR-gate OR1 is 1. The other programming bits are then chosen as a function of the required divisor. In effect, as has been demonstrated in said document, if one seeks to obtain a period on the output of a cell of rank p, there are to be $2^p+N$ periods on the input of the first cell available (where $N=PGM_1+2.PGM_2+\ldots+2^p \cdot PGM_p+1$). For example, to obtain a divisor equal to 12, one has to choose $PGM_5=0$, $PGM_4=1$, $PGM_3=1$, $PGM_2=0$ and $PGM_1$ is 0.

If the required divisor is less than 8, cell CD3 is to be disabled and $PGM_3$ is thus to be equal to 0. The output of gate OR2 is then equal to 0 and thus the second input signal of cell CD2 is continuously equal to 1.

Likewise, if the required divisor is smaller than 4, the cell CD2 is also to be disabled and thus bit $PGM_2$ is to be equal to 0.

The timing diagram of FIG. 7 shows the state of the input and output signals of the various cells of a divider circuit as shown in FIG. 6 in the case of a division by 12.

In this case, as has been explained above, the cell CD4 is disabled, cell CD3 divides by three and cells CD2 and C1 divide by two. Between the instants t0 and t12 there are thus 12 periods of the input frequency signal $FI_1$, 6 periods of the signal $FI_2$, 3 periods of the signal $FI_3$ and 1 period of the output frequency signal $FO_3$, the second period of signal $FI_3$, between instants t4 and t8, being "swallowed" by cell CD3 to perform a division by 3. The enable signal received on the second input $SI_3$ of the cell CD3 is continuously 1; the enable signal received on the second input $SI_2$ of cell CD2 has a period lying between the instants t2 and t14, equal to the period of the output frequency signal $FO_3$, and its duty cycle is equal to ⅓; the enable signal received on the second input $SI_1$ of cell C1 has a period lying between the instants t3 and t15, equal to the period of the output frequency signal $FO_3$, and its duty cycle is equal to ⅙; finally, the signal supplied on the second output $SO_1$ of the first cell C1 has a period lying between the instants t3.5 and t14.5 equal to the period of the output frequency signal $FO_3$ and its duty cycle is equal to 1/12.

For certain applications of such a divider circuit and, more specifically, when it is used in a frequency synthesizer based on CMOS logic, it is necessary to increase this duty cycle which is lower as the input frequency is higher.

Therefore, the output of the divider circuit is connected to a circuit 5 for increasing the duty cycle of the output signal. This circuit is formed by a flip-flop of the RS type which has two AND-gates denoted AND4 and AND5, the first and second inputs of the AND-gate AND5 receiving the inverse of the output signal $SO_1$ of the divider circuit and the inverse of the output signal of AND-gate AND4, respectively, whereas the first and second inputs of the AND-gate AND4 receive the inverse of the output signal of the AND-gate AND5 and of the output signal of the CMOS/ECL converter denoted C/E respectively, which converter itself is connected to a first input of a phase comparator 20 of a frequency synthesizer. The output of the AND-gate AND5 is further connected to the input of an ECL/CMOS converter denoted E/C, whose output is connected to said input of the phase comparator 20.

Then, the output of AND-gate AND5 becomes zero with a rising edge of the output signal of the divider circuit and it remains so after this output signal has disappeared until the output of the AND-gate AND4 also becomes zero after the ECL/CMOS/ECL conversion. The comparator will thus have received the high edge of the output signal of the divider circuit.

Figure 8:
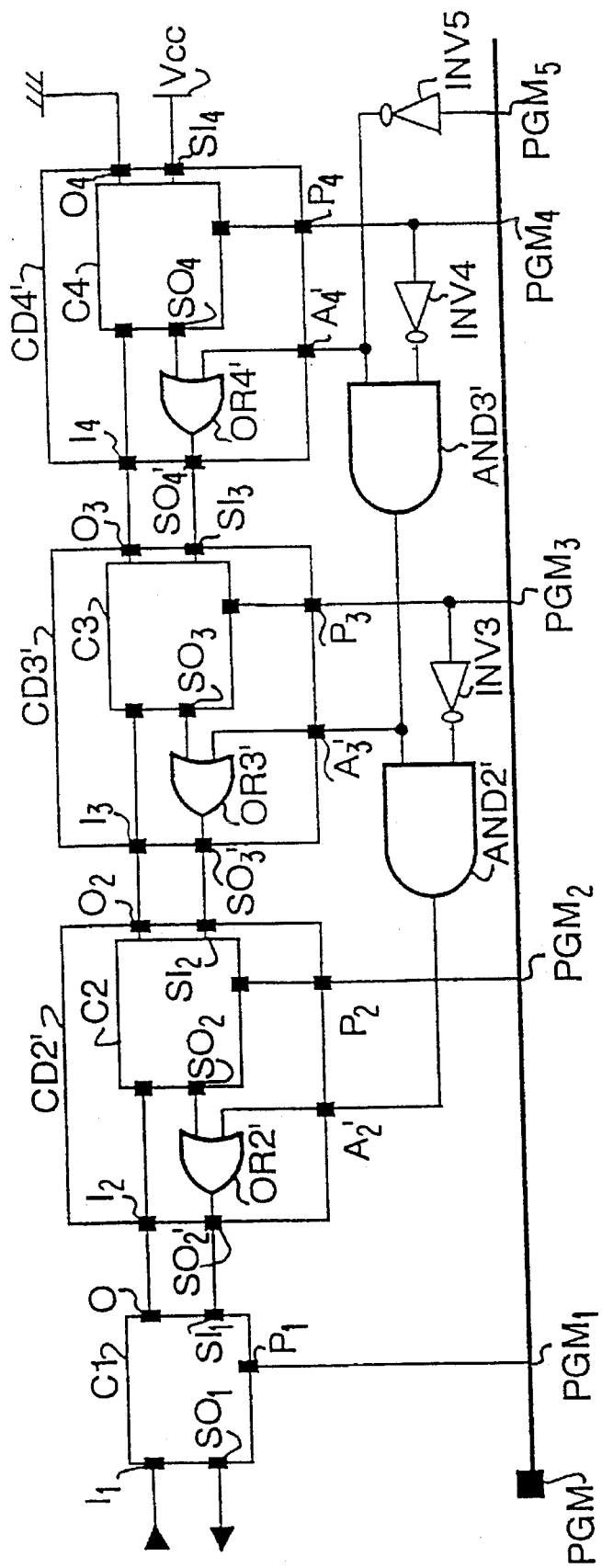
FIG. 8 shows a second embodiment for a divider circuit according to the invention whose division factor varies between 2 and 31.

FIG. 8 shows another embodiment for a divider circuit according to the invention. The cells that may be disabled are different from those of FIG. 6 and are denoted CDi'.

Each cell CDi' is formed by a conventional cell Ci as shown in FIG. 1, the output $SO_i$ of this cell being connected to a first input of an OR-gate denoted ORi' whose output forms the output $SO_i'$ of the cell $CD_i'$. The other input of the gate $OR_i'$ is connected to an additional input Ai' of the cell $CD_i'$. The other inputs $I_i$, $SI_i$ and $P_i$ of the cell Ci form the first, second and third inputs of cell CDi'.

As in FIG. 6, the division factor of the divider circuit varies between 2 and 31 and it is fixed by a programming word PGM of five bits denoted $PGM_i$ (where i varies between 1 and 5). Such a divider circuit comprises, in a cascade combination, a conventional cell C1 followed by three cells that may be disabled CD2', CD3' and CD4', so that the first output $O_i$ of a cell of rank i is connected to the first input $I_{i+1}$ of the cell of rank i +1, and the second output $SO_i'$ of a cell of rank i is connected to the second input $SI_{i-1}$ of the cell of rank i−1. The first input of the cell C1 receives the signal to be divided $FI_1$ and its second output $SO_1$, which supplies a signal having a frequency equal to that of the output frequency signal of the last active cell, forms the output of the divider circuit. The first output of the host cell CD4' is connected to ground and its second input is connected to the supply voltage terminal Vcc so that it continuously has the logic 1 level.

The cells CD2', CD3' and CD4' have each an additional input denoted $A_2'$, $A_3'$ and $A_4'$, respectively. The fifth bit $PGM_5$ of the programming word is carried, after being inverted by an inverter INV5, to the additional input $A_4'$ of cell CD4' and also to a first input of an AND-gate denoted AND3'. The fourth and third bits $PGM_4$ and $PGM_3$ are carried to the programming inputs $P_4$ and $P_3$, respectively, and, after being inverted by an inverter INV4 and INV3, respectively, to a second input of the AND-gate AND3' and to a first input of an AND-gate denoted AND2', respectively. The second and first bits $PGM_2$ and $PGM_1$ are carried to the programming inputs $P_2$ and $P_1$, respectively, of the cells CD2' and CD1. The output of the AND-gate AND3' is connected to an additional input $A_3'$ of cell DC3' and also to a second input of the AND-gate AND2'. Similarly, the output of the AND-gate AND2' is connected to the additional input $A_2'$ of cell CD2'.

Thus, cell CD4' is disabled for the value $PGM_5=0$, whereas in this case the output SO4' of the cell is continuously 1. Similarly, CD3' is disabled for the values $PGM_5= PGM_4=0$ and cell CD2' is disabled for the values $PGM_5= PGM_4=PGM_3=0$.

Figure 9:
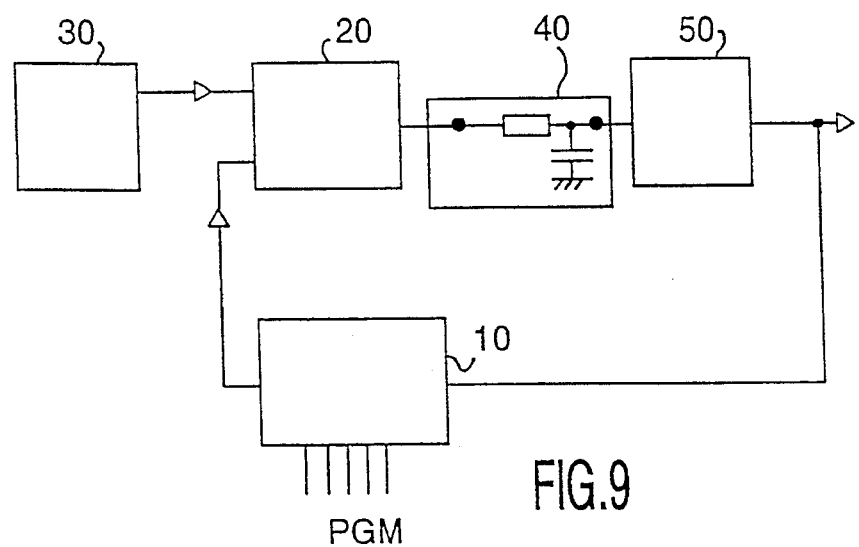
FIG. 9 shows a frequency synthesizer which utilizes a programmable frequency divider circuit according to the invention.

FIG. 9 shows a frequency synthesizer which utilizes a divider circuit as described hereinbefore. This frequency synthesizer comprises a frequency divider circuit 10 of which the output is connected to a first input of a phase comparator circuit 20. A second input of this phase comparator circuit 20 receives a frequency produced by a quartz oscillator 30. This phase comparator 20 is connected to an integrating circuit 40 whose output controls a variable oscillator 50. The output of this variable oscillator is connected to the input of divider circuit 10 and forms the output of the frequency synthesizer.

Figure 10:
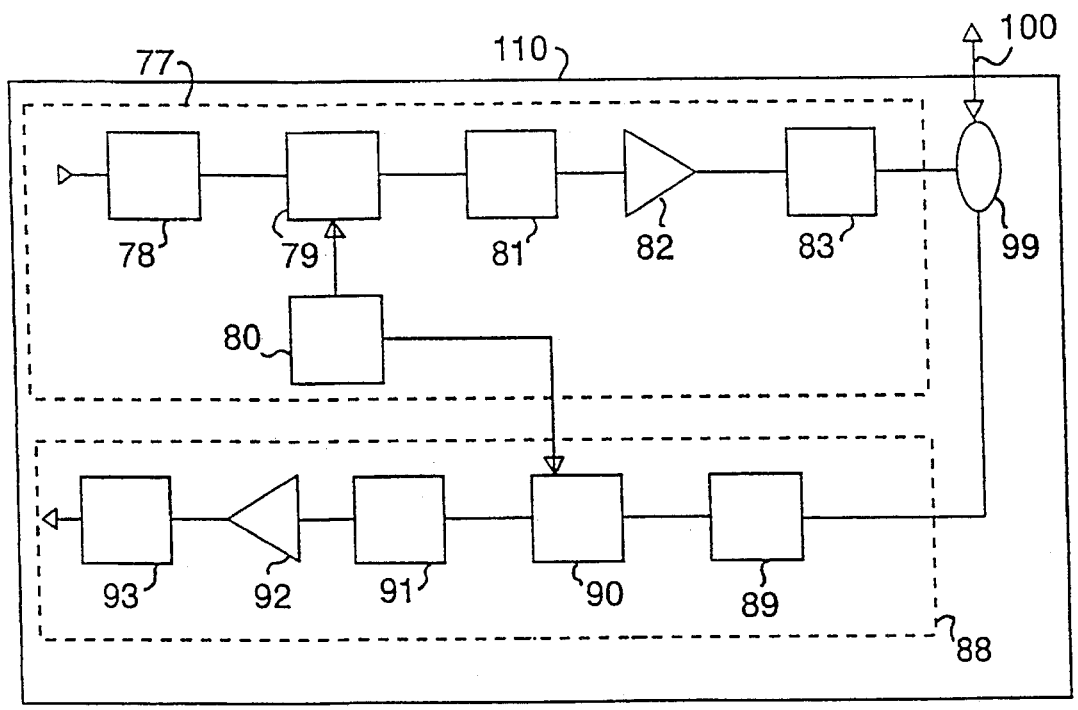
FIG. 10 shows a radio telephone of which the transmitter and receiver circuits utilize a frequency synthesizer as shown in FIG. 9.

FIG. 10 shows in a diagram a radio telephone 110 which comprises a transmitter circuit 77 and a receiver circuit 88 connected to a transceiving antenna 100 via a circulator 99 and utilizing a frequency synthesizer as is shown in FIG. 8.

The transmitter circuit 77 comprises a modulator 78 which produces an intermediate frequency signal fi which is carried to a first input of a mixer circuit 79 of which a second input receives an output signal of the frequency synthesizer 80 as described with reference to FIG. 8. The output of this mixer circuit 79 is connected to a filter 81 itself connected to an amplifier 82. The output of this amplifier 82 then passes to a second filter 83 before it is delivered to the circulator 99.

The receiver circuit 88 comprises a filter 89 connected to the output of the circulator 99. The output of this filter 89 is connected to a first input of a mixer circuit 90 of which a second input receives an output signal of the frequency synthesizer 80. The output of this mixer circuit 90 is connected to a filter 91 itself connected to an automatic gain control amplifier 92. The output of this amplifier 92, finally, is connected to a demodulator 93.

It will be obvious that modifications can be made to the embodiments which have just been described, more specifically, by substituting equivalent technical means, without leaving the scope of the invention.

Two different embodiments of the divider circuit have been described, but other logic means may lead to the same result.

Moreover, one could also have selected to disable other cells than the cells at the end of the circuit. For example, it is possible to disable the cells at the beginning of the circuit and to determine in each case the input to be used.

Similarly, one could have chosen to select another output of the divider circuit than the second output of the first cell of the circuit.

Finally, the frequency synthesizer shown in FIG. 9 and the radio telephone of FIG. 10 are shown diagrammatically to show the main functional blocks which form them. They can be formed in a great many variants which is known to those skilled in the art and does not need to be described here.

I claim:

1. A programmable frequency divider circuit comprising p cascade-connected frequency-dividing cells, where p is an integer greater than one, each of said p cascade-connected frequency-dividing cells representing a division of rank i, all of said p cascade-connected frequency-dividing cells being switchable between a normal divide-by-two mode, and a programmed divide-by-three mode, each of said p cascade-connected frequency-dividing cells comprising:

a first input for receiving an input frequency signal;

a first output for supplying an output frequency signal to be applied to the first input of an immediately following cascade-connected frequency-dividing cell;

a second input for receiving an enable signal for the programmed mode;

a third input for receiving a programming signal; and a second output for supplying a signal generated in response to the enable signal applied to the second input, wherein said signal at the second output of one of said p cascade-connected frequency-dividing cells is applied to the second input of immediately preceding cascade-connected frequency-dividing cell as an enable signal, characterized in that at least one of said p cascade-connected frequency-dividing cells further comprises an additional input for receiving a signal to disable said at least one cascade-connected frequency-dividing cell.

2. A programmable frequency divider circuit as claimed in claim 1, wherein q of said p cascade-connected frequency-dividing cells, q being an integer equal to or less than p, comprise said additional input, said q cascade-connected frequency-dividing cells ranging from position p-q to position p, characterized in that said programmable frequency divider circuit comprises:

means for disabling said q cascade-connected frequency-dividing cells; and means for selecting an output signal of said programmable frequency divider circuit which has the same frequency as the output frequency signal of the cascade-connected frequency-dividing cell in the position p-q-1.

3. A programmable frequency divider circuit as claimed in claim 2, characterized in that for disabling one of said q cascade-connected frequency-dividing cells, the programmable frequency divider circuit comprises means for supplying a continuous active enable signal to the second input of the immediately preceding cascade-connected frequency-dividing cell.

4. A programmable frequency divider circuit as claimed in claim 3, characterized in that each cascade-connected frequency-dividing cell comprises:

a divide-by-two divider stage having an input coupled to the first input for receiving the input frequency signal, said divide-by-two divider stage comprising a first and a second D-type flip-flop inversely timed relative to each other by said input frequency signal, an output of the second D-type flip-flop, which forms the first output of the cascade-connected frequency-dividing cell, being coupled to data input of the first flip-flop; and a swallow stage comprising a third and a fourth D-type flip-flop, and swallowing means, coupled to an output of the fourth flip-flop, for selectively constraining the data input of the first flip-flop thereby affecting a division by three of said input frequency signal ($FI_i$) when the programming and enabling signals at the third and second inputs of the cascade-connected frequency-dividing cell are active, and characterized in that in each of said q cascade-connected frequency-dividing cells, the third flip-flop comprises a disabling input coupled to the additional input of said cascade-connected frequency-dividing cell, said disabling input, when an activation signal applied to the disabling input is no longer active, bringing the output signal of the third flip-flop, which forms the second output of the cascade-connected frequency-dividing cell, to a continuously active level.

5. A programmable frequency divider circuit as claimed in claim 4, characterized in that said enabling signal, applied to each cascade-connected frequency-dividing cell, is formed by a logical "AND" operation between the programming and enabling signals of an immediately following cascade-connected frequency-dividing cell.

6. A programmable frequency divider circuit as claimed in claim 2, characterized in that the programmable frequency divider circuit comprises means for tapping the signal supplied on the second output of the first cascade-connected frequency-dividing cell as an output signal.

7. A programmable frequency divider circuit as claimed in claim 6, characterized in that the programmable frequency divider circuit comprises means for increasing a duty cycle of said output signal.

8. A frequency synthesizer comprising an oscillator for generating a fixed oscillation signal; a phase comparator circuit having a first input coupled to an output of said oscillator; an integrating circuit couple to an output of the phase comparator circuit; a variable oscillator coupled to an output of the integrating circuit, an output of the variable oscillator forming an output of the frequency synthesizer; and a programmable frequency divider circuit having an input coupled to the output of the variable oscillator and an output coupled to a second input of said phase comparator circuit, characterized in that the programmable frequency divider circuit comprises p cascade-connected frequency-dividing cells, where p is an integer greater than one, each of said p cascade-connected frequency-dividing cells representing a division of rank i, all of said p cascade-connected frequency-dividing cells being switchable between a normal divide-by-two mode, and a programmed divide-by-three mode, each of said p cascade-connected frequency-dividing cells comprising:

a first input for receiving an input frequency signal;

a first output for supplying an output frequency signal to be applied to the first input of a following cascade-connected frequency-dividing cell;

a second input for receiving an enable signal for the programmed mode;

a third input for receiving a programming signal; and a second output for supplying a signal generated in response to the enable signal applied to the second input, wherein said signal at the second output of one of said p cascade-connected frequency-dividing cells is applied to the second input of an immediately preceding cascade-connected frequency-dividing cell as an enable signal, characterized in that at least one of said p cascade-connected frequency-dividing cells further comprises an additional input for receiving a signal to disable said at least one cascade-connected frequency-dividing cell.

9. Radio telephone having a transmitter circuit and a receiver circuit, said transmitter circuit comprising a modulator for producing an intermediate frequency signal, a first mixer circuit having a first input for receiving said intermediate frequency signal, a first filter coupled to an output of said first mixer circuit, a first amplifier coupled to an output of said first filter, and a second filter coupled to an output of said first amplifier; and said receiver circuit comprising a third filter, a second mixer circuit having a first input coupled to an output of said third filter, a fourth filter coupled to an output of said second mixer, a second amplifier coupled to an output of said fourth filter, and a demodulator coupled to an output of said second amplifier, said radio telephone further comprising a transceiving antenna and a two-way circulator coupled to said transceiving antenna, said two-way circulator having an input for receiving the output from the second filter for transmission by said transceiving antenna, and an output coupled to the third filter for application of a signal received by said transceiving antenna, wherein said radio telephone further comprises a frequency synthesizer comprising an oscillator for generating a fixed oscillation signal; a phase comparator circuit having a first input coupled to an output of said oscillator; an integrating circuit couple to an output of the phase comparator circuit; a variable oscillator coupled to an output of the integrating circuit, an output of the variable oscillator forming an output of the frequency synthesizer; and a programmable frequency divider circuit having an input coupled to the output of the variable oscillator and an output coupled to a second input of said phase comparator circuit, characterized in that the programmable frequency divider circuit comprises p cascade-connected frequency-dividing cells, where p is an integer greater than one, each of said p cascade-connected frequency-dividing cells representing a division of rank i, all of said p cascade-connected frequency-dividing cells being switchable between a normal divide-by-two mode, and a programmed divide-by-three mode, each of said p cascade-connected frequency-dividing cells comprising:

a first input for receiving an input frequency signal;

a first output for supplying an output frequency signal to be applied to the first input of a following cascade-connected frequency-dividing cell;

a second input for receiving an enable signal for the programmed mode;

a third input for receiving a programming signal; and a second output for supplying a signal generated in response to the enable signal applied to the second input, wherein said signal at the second output of one of said p cascade-connected frequency-dividing cells is applied to the second input of an immediately preceding cascade-connected frequency-dividing cell as an enable signal, characterized in that at least one of said p cascade-connected frequency-dividing cells further comprises an additional input for receiving a signal to disable said at least one cascade-connected frequency-dividing cell.

* * * * *